United States Patent
Ishii et al.

(10) Patent No.: US 6,551,724 B2
(45) Date of Patent: Apr. 22, 2003

(54) ORGANIC ELECTRO-LUMINESCENT DISPLAY PANEL

(75) Inventors: Ikuko Ishii, Tokyo (JP); Yoshikazu Sakaguchi, Tokyo (JP); Mitsuma Ooishi, Tokyo (JP); Joji Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/750,805

(22) Filed: Dec. 28, 2000

(65) Prior Publication Data

US 2001/0046579 A1 Nov. 29, 2001

(30) Foreign Application Priority Data

Dec. 28, 1999 (JP) .............................. 11-374834

(51) Int. Cl.⁷ ................. H05B 33/00; B05D 5/12; C09K 11/00
(52) U.S. Cl. ............... 428/690; 428/917; 428/76; 313/512; 313/506; 427/66; 257/100; 156/67; 156/230
(58) Field of Search ............ 427/66; 428/690, 428/917, 68, 76, 192; 313/504, 512, 506; 257/98, 100; 156/67, 230, 235, 275.5, 291

(56) References Cited

U.S. PATENT DOCUMENTS

| | | | |
|---|---|---|---|
| 5,189,405 A | * 2/1993 | Yamashita et al. | 340/781 |
| 6,198,220 B1 | * 3/2001 | Jones et al. | 313/512 |
| 6,210,815 B1 | * 4/2001 | Ooishi | 428/690 |
| 6,268,695 B1 | * 7/2001 | Affinito | 313/504 |
| 6,280,559 B1 | * 8/2001 | Terada et al. | 156/295 |
| 6,284,342 B1 | * 9/2001 | Ebisawa et al. | 428/69 |

FOREIGN PATENT DOCUMENTS

| | | |
|---|---|---|
| DE | 30 10 164 | 11/1982 |
| EP | 0 350 907 | 1/1990 |
| EP | 0 500 382 | 8/1992 |
| EP | 0 969 700 | 1/2000 |
| JP | 61-96695 | 5/1986 |
| JP | 03-261091 | 11/1991 |
| JP | 9-148066 | 6/1997 |
| JP | 10-314580 | 12/1998 |
| JP | 11-040344 | 2/1999 |
| JP | 11-329718 | 11/1999 |
| JP | 11-329719 | 11/1999 |
| JP | 2000-156287 | 6/2000 |
| JP | 2000-164349 | 6/2000 |
| JP | 2000-357587 | 12/2000 |
| JP | 2001-079369 | 3/2001 |
| JP | 2001-167875 | 6/2001 |
| KR | 1991-0014001 | 8/1991 |

* cited by examiner

Primary Examiner—Cynthia H. Kelly
Assistant Examiner—Dawn Garrett
(74) Attorney, Agent, or Firm—Katten Muchin Zavis Rosenman

(57) ABSTRACT

An organic electro-luminescent display panel and a method of manufacturing same are provided which are capable of reliably holding a hygroscopic agent in its sealing cap in a uniform and thin state and of being easily manufactured and of being configured to be of a thin-profile type, without sacrificing light-emitting characteristics and display contrast. The organic electro-luminescent display panel is constructed of a transparent insulating substrate, an organic electro-luminescent device formed on the transparent insulating substrate and a sealing cap to make up sealed space hermetically containing the organic electro-luminescent device in cooperation with the insulating substrate. The hygroscopic agent is enclosed hermetically in the sealed space and is of a powder or grain type, which is sandwiched between the sealing cap and an air-permeable sheet.

18 Claims, 8 Drawing Sheets

8; adhesive
7; air-permeable sheet
10; air-permeable gluing agent layer
6; hygroscopic agent
5; sealing cap

FIG.4B

9; inert gas
7; air-permeable sheet
5; sealing cap
10; air-permeable gluing agent layer
6; hygroscopic agent

ORGANIC ELECTRO-LUMINESCENT DISPLAY PANEL

BACKGROUND OF THE INVENTION

1. Field of the Invention

The present invention relates to an organic EL (Electro-luminescent) display device operating based on an electroluminescent phenomenon and a method for manufacturing a same and more particularly to the organic EL display device in which a hygroscopic agent is enclosed hermetically and a method for manufacturing a same.

The present application claims priority of Japanese Patent Application No. Hei 11-374834 filed on Dec. 28, 1999, which is hereby incorporated by reference.

2. Description of the Related Art

An EL display device using an electroluminescent phenomenon, since it has various advantages in that it can be configured so as to be of a spontaneous light-emitting type and of a thin flat-panel type, that it draws less power, that it can provide better viewability and fast responsivity and that it can display moving images, is considered to be promising for wider applications. Two types of EL display devices are known, one being an inorganic EL display device employing inorganic materials and another being an organic EL display device employing organic thin films. In recent years, since various organic luminescent compounds have been developed which enable light-emitting in multiple colors and allow a full color EL display device to be implemented, development of the organic EL display device is being promptly pursued. Such the organic EL display device is fabricated based on a phenomenon in which light is emitted when a hole injected from an anode and an electron injected from a cathode are recombined in a light-emitting layer composed of an organic luminescent substance having a fluorescent capability contained in an organic thin-film sandwiched between the anode and the cathode, that is, when they are changed from an excited state to a deactivated state. Moreover, recent prompt advancement of the EL display device is also attributable to greatly improved light-emitting efficiency and luminance achieved by employing a structure in which hole transporting layers and/or electron transporting layers are stacked as the light-emitting layer.

Though improvements have been made to increase its display life to a considerable extent, there are still left many factors of deterioration including occurrence of a dark spot being a region where no light is emitted, and sufficiently satisfactory display life has not yet been implemented. One of the factors of deterioration is an influence of moisture which is a problem specific to organic thin-film materials. That is, the organic EL device using such organic thin-film materials is easily affected by moisture existing in an area surrounding the organic EL display device; for example, there is a case where moisture permeating through an interface between a light-emitting layer and an electrode interferes with injection of an electron, causing occurrence of dark spots and corrosion of the electrode. To solve this problem, methods for preventing or removing the influence of moisture or a like by sealing the organic EL device hermetically are proposed. To prevent the influence of moisture, the organic EL device is put into a container being impermeable to moisture and is then enclosed together with nitrogen gas hermetically. Moreover, to remove the influence of moisture, a hygroscopic agent is enclosed into the moisture-impermeable container in which the organic EL device and the nitrogen gas are enclosed together.

Figure 8:
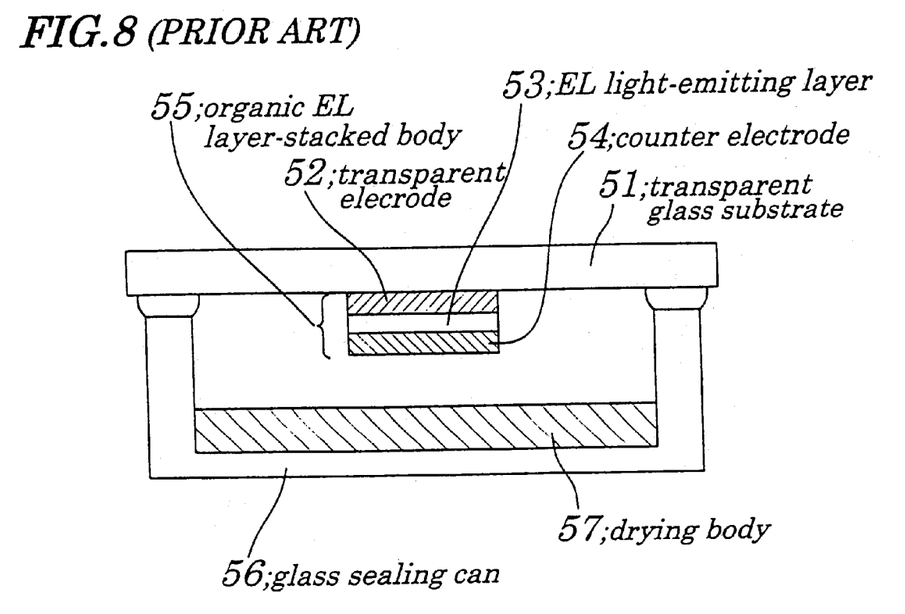
FIG. 8 is a cross-sectional view of a first conventional organic EL display panel in a sealing cap of which a hygroscopic agent is enclosed hermetically.

FIG. 8 is a cross-sectional view of a conventional organic EL display panel in a sealing cap of which a hygroscopic agent is enclosed hermetically in order to remove an influence of moisture, which is disclosed in Japanese Patent Application Laid-open No. Hei 9-148066 (hereinafter referred to as a "first conventional example"). As shown in FIG. 8, the organic EL display device of the first conventional example is mainly constructed of a transparent glass substrate 51, an organic EL layer-stacked body 55 composed of a transparent electrode 52 (as an anode) made from ITO (Indium Tin Oxide) or a like, an EL light-emitting layer 53 made from an organic EL material or a like and a counter electrode (as a cathode) 54, each being stacked in this order, a glass sealing can 56 to seal the organic EL layer-stacked body 55 and a drying body 57 composed of a hygroscopic agent adhering to an inside surface of the glass sealing can 56. To enclose the above drying body 57 in the glass sealing can 56, two methods are available; one in which a hygroscopic compound is solidified to produce a formed body which is then fixed in the glass sealing can 56 and another in which the hygroscopic compound is put into an air-permeable bag which is then fixed in the glass sealing can 56.

Figure 9:
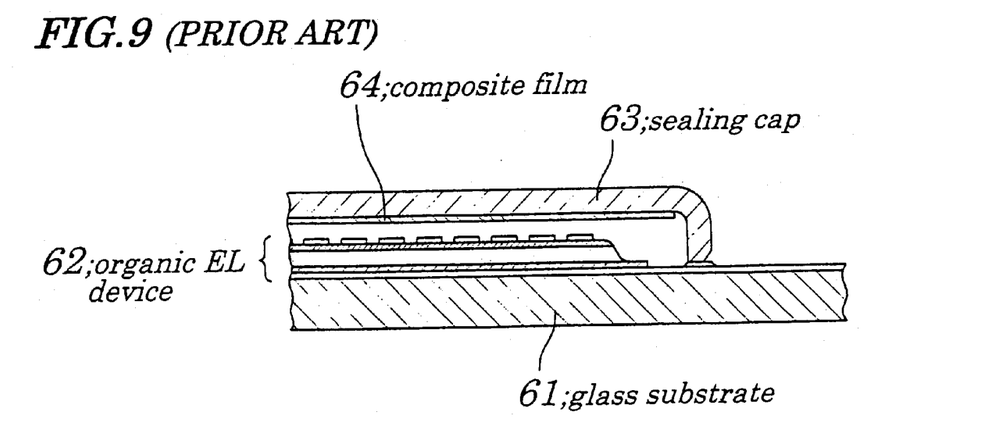
FIG. 9 is a cross-sectional view of a second conventional organic EL display panel in a sealing cap of which a hygroscopic agent is enclosed hermetically.

FIG. 9 is a cross-sectional view of another conventional organic EL display panel in a sealing cap of which a hygroscopic agent is enclosed hermetically, which is disclosed in Japanese Patent Application Laid-open No. Sho 61-96695 (hereinafter referred to as a "second conventional example"). As shown in FIG. 9, the organic EL display panel in the second conventional example is same as that in the first conventional example in that an organic EL device 62 formed on a glass substrate 61 is sealed hermetically by a sealing cap 63. However, the organic EL display panel in the second conventional example differs from that in the first conventional example in that, instead of the drying body 57 employed in the first conventional example, a composite film 64 formed by making a composite substance composed of zeolite serving as the hygroscopite agent, a carbon powder serving as a light-shielding substance, a light-absorbing substance and an organic resin serving as a binder, into a film-like material, is stuck to an inside surface of the sealing cap 63. By configuring as above, an attempt has been made to implement the organic EL display panel having a tolerable life characteristic and contrast and being readily manufactured.

However, in the first conventional example, if the method in which the hygroscopic compound is solidified by using a binder to produce the formed body is employed when the drying body 57 is enclosed in the glass sealing can 56, since an exposed surface area of the hygroscopic agent is made small, it causes a decrease in hygroscopic capability and, since mechanical strength of the formed body is required to some extent, the drying body 57 is not allowed to be thinner. Therefore, the organic EL display device of the first conventional example is not suitable for application for a thin-type organic EL display. Moreover, in the organic EL display device of the first conventional example, if the method in which the hygroscopic compound is put into the air-permeable bag which is then fixed in the glass sealing can 56 is employed, it is difficult to give a fixed shape to the drying body 57 because it is contained in a bag having no definite shape and, when the organic EL display panel is put in an inclined state, the drying body 57 containing the hygroscopic agent easily moves and leans, causing a touch with the organic EL layer-stacked body 55 which leads to deterioration of the organic EL layer-stacked body 55 by an external force.

Moreover, in the second conventional example, if the composite film 64 is peeled off from the sealing cap 63, it comes in touch with the organic EL device 62, causing damage to the EL device 62. Since hygroscopic agent, carbon powder and binder are mixed to produce the composite film 64, there is a risk that a function of the hygroscopic agent itself and/or a function of the light-shielding substance itself cannot be sufficiently implemented. Additionally, when components contained in the binder being an organic resin are partially left unreacted, the organic EL device is adversely affected by them.

SUMMARY OF THE INVENTION

In view of the above, it is an object of the present invention to provide an organic EL display panel which is capable of reliably holding a hygroscopic agent in its sealing cap in a manner so as to be stuck in a uniform and thin state and of being easily manufactured and of being configured to be of a thin-profile type, without sacrificing light-emitting characteristics and display contrast, and a method of manufacturing a same.

According to a first aspect of the present invention, there is provided an organic EL display panel including:

a transparent insulating substrate;

an organic EL device formed on the transparent insulating substrate;

a sealing cap to make up sealed space hermetically containing the organic EL device in cooperation with the transparent insulating substrate; and wherein a hygroscopic agent is enclosed hermetically in the sealed space and disposed in a manner to be sandwiched between the sealing cap and an air-permeable sheet.

In the foregoing, a preferable mode is one wherein a gluing agent layer to which the hygroscopic agent is stuck is mounted on an inside surface of, at least, either of the sealing cap or the air-permeable sheet.

Also, a preferable mode is one wherein the hygroscopic agent is of a powder or grain type.

Also, a preferable mode is one wherein the air-permeable sheet is a dark color sheet.

Also, a preferable mode is one wherein the air-permeable sheet is an ultraviolet-ray blocking sheet.

Also, a preferable mode is one wherein the hygroscopic agent is stuck to the air-permeable sheet with an adhesive sandwiched between the hygroscopic agent and said air-permeable sheet.

Also, a preferable mode is one wherein the gluing agent layer is mounted on a main surface of the air-permeable sheet being opposite to the sealing cap and wherein the hygroscopic agent in powder or grain form is stuck to the air-permeable sheet with a region of the gluing agent layer other than its edge region sandwiched between the hygroscopic agent and the air-permeable sheet while the air-permeable sheet is bonded to the sealing cap with the edge region of the gluing agent layer sandwiched between the air-permeable sheet and the sealing cap.

According to a second aspect of the present invention, there is provided a method for manufacturing an organic EL display panel to produce the organic EL display panel provided with a transparent insulating substrate, an organic EL device formed on the transparent insulating substrate and a sealing cap hermetically containing the organic EL device to form sealed space enclosing hygroscopic agent in coop eration with the transparent insulating substrate, the method including:

a process of preparing an air-permeable sheet provided with a gluing agent layer covered with released paper on its surface;

a process of partitioning a region of the gluing agent layer into a first gluing agent region for sticking the hygroscopic agent in powder or grain form and second gluing agent region for bonding the air-permeable sheet to the sealing cap;

a process of peeling off a portion of the released paper covering the first gluing agent region to expose the first gluing agent region and sticking the hygroscopic agent in powder or grain form to the exposed first gluing agent region; and a process of peeling off a remaining portion of the released paper to expose the second gluing agent region and bonding the air-permeable sheet with the hygroscopic agent being stuck to the sealing cap with the exposed second gluing agent region sandwiched between the air-permeable sheet and the sealing cap.

According to a third aspect of the present invention, there is provided a method for manufacturing an organic EL display panel to produce said organic EL display panel provided with a transparent insulating substrate, an organic EL device formed on said transparent insulating substrate and a sealing cap hermetically containing said organic EL device to form sealed space enclosing a hygroscopic agent in cooperation with the transparent insulating substrate, the method including:

a process of preparing an air-permeable sheet with a gluing agent layer mounted on a surface of the air-permeable sheet;

a process of partitioning a region of the gluing agent layer into a first gluing agent region for sticking the hygroscopic agent in powder or grain form and second gluing agent region for bonding the air-permeable sheet to the sealing cap;

a process of holding mold members to the second gluing agent region with the first gluing agent region being left exposed and sticking the hygroscopic agent on the exposed first gluing agent region to the first gluing agent region; and a process of making the second gluing agent region exposed by removing the mold members and bonding the air-permeable sheet with the hygroscopic agent stuck to the sealing cap with the exposed second gluing agent region sandwiched between the air-permeable sheet and the sealing cap.

In the foregoing, it is preferable that edge portion of the gluing agent layer is used as the second gluing agent region and remaining portion of the gluing agent layer other than the edge portion is used as the first gluing agent region.

Also, it is preferable that a demarcation line is provided by giving a break to the released paper covering the gluing agent layer to partition the gluing agent region into the first gluing agent region and the second gluing agent region.

Furthermore, it is preferable that, after the air-permeable sheet to which the hygroscopic agent in powder or grain form is stuck has been bonded to the sealing cap, the sealing cap is junctioned, in an atmosphere of inert gas, to the transparent insulating substrate by using an ultraviolet setting adhesive sandwiched between the sealing cap and the transparent insulating substrate.

With the above configurations, since the organic EL display device is so constructed that the hygroscopic agent in powder or grain form is uniformly held on the air-permeable sheet using the gluing agent layer mounted to the back of the air-permeable sheet, it is possible to fabricate the organic EL display device of a thinner type and to prevent the hygroscopic agent from being moved and leaning within the sealing cap. Moreover, even when the hygroscopic agent happens to be peeled, since it is held by the air-permeable sheet, deterioration of the organic EL device can be prevented. Furthermore, since the hygroscopic agent is of the powder or grain type, a wide surface area of the hygroscopic agent is secured, thus providing a high hygroscopic efficiency and a stable light-emitting characteristic. Also, by using the dark color sheet, visible light can be absorbed, thus preventing reflection of light from the back when the organic EL display panel is ON and providing excellent display contrast.

With another configuration as above, since the air-permeable sheet with the gluing agent layer covered with the released paper is used and the region of the gluing agent layer is partitioned into two regions, one being the first gluing agent region (the region other than its edge region) used for sticking the hygroscopic agent in powder or grain form to the air-permeable sheet and the other being the second gluing agent region (edge region) used for bonding the air-permeable sheet to the sealing cap and the released paper existing inside the demarcation line is peeled off to stick the hygroscopic agent to the first gluing agent region while the released paper existing outside the demarcation line is peeled off to bond the sealing cap to a glass substrate with the second gluing agent region sandwiched between them, when the hygroscopic agent is stuck to the first gluing agent region, a trouble of adhesion of the hygroscopic agent to the second gluing region can be prevented and therefore weakening of the adhesive strength of the second gluing region to bond the sealing cap to the glass substrate can be avoided, thus enabling prompt, easy and reliable mounting of the hygroscopic agent. Moreover, by using the ultraviolet-ray blocking type air-permeable sheet, when ultraviolet-ray setting adhesive is irradiated with ultraviolet rays from the sealing cap side, the organic EL light-emitting layer being susceptible to ultraviolet rays can be protected efficiently against ultraviolet rays.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

Figure 1:
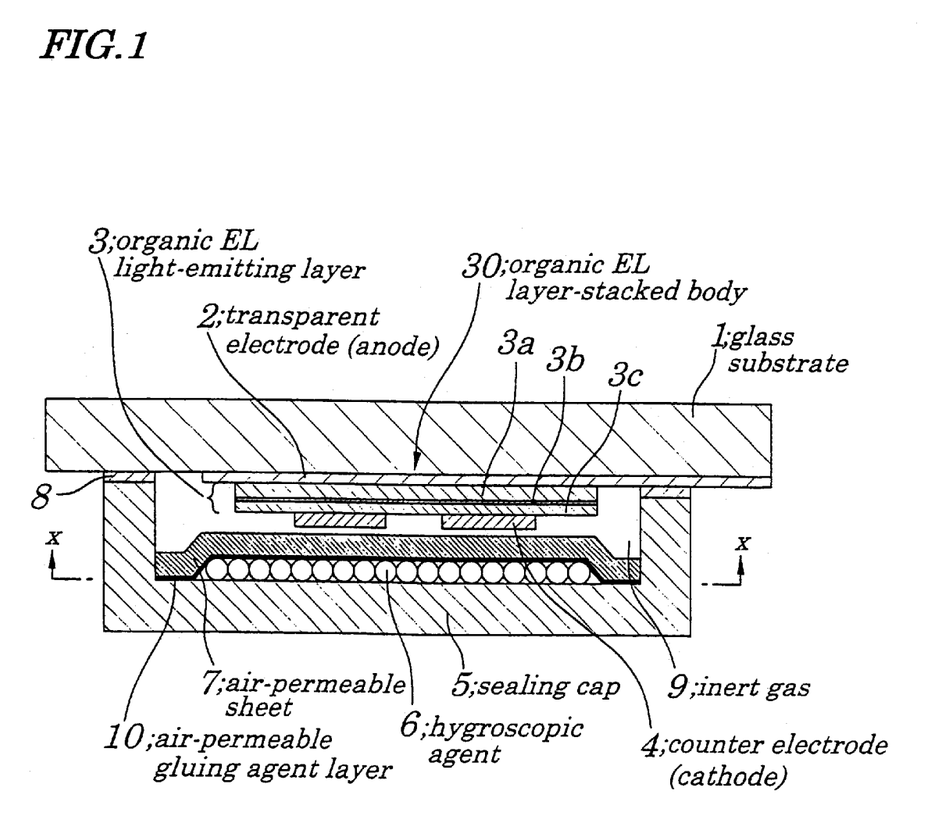
FIG. 1 is a cross-sectional view showing configurations of an organic EL display panel according to a first embodiment of the present invention.
Figure 2A:
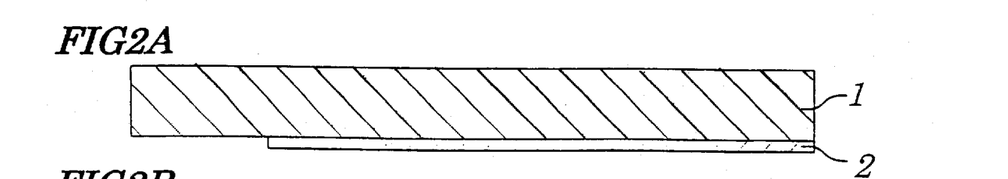
FIGS. 2A to 2C are process diagrams showing a process, that is, a process of forming the organic EL layer-stacked body, in a method of manufacturing the organic EL display panel according to the first embodiment.
Figure 2B:
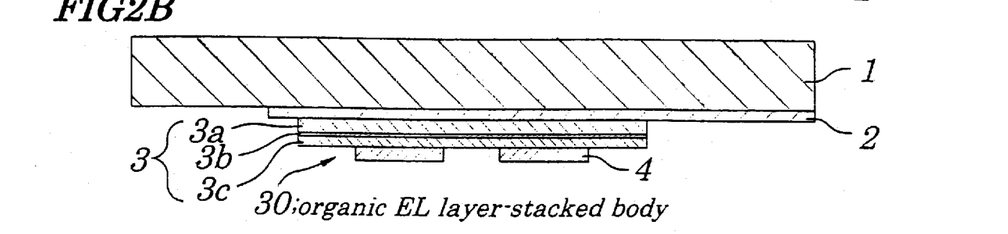
Figure 2C:
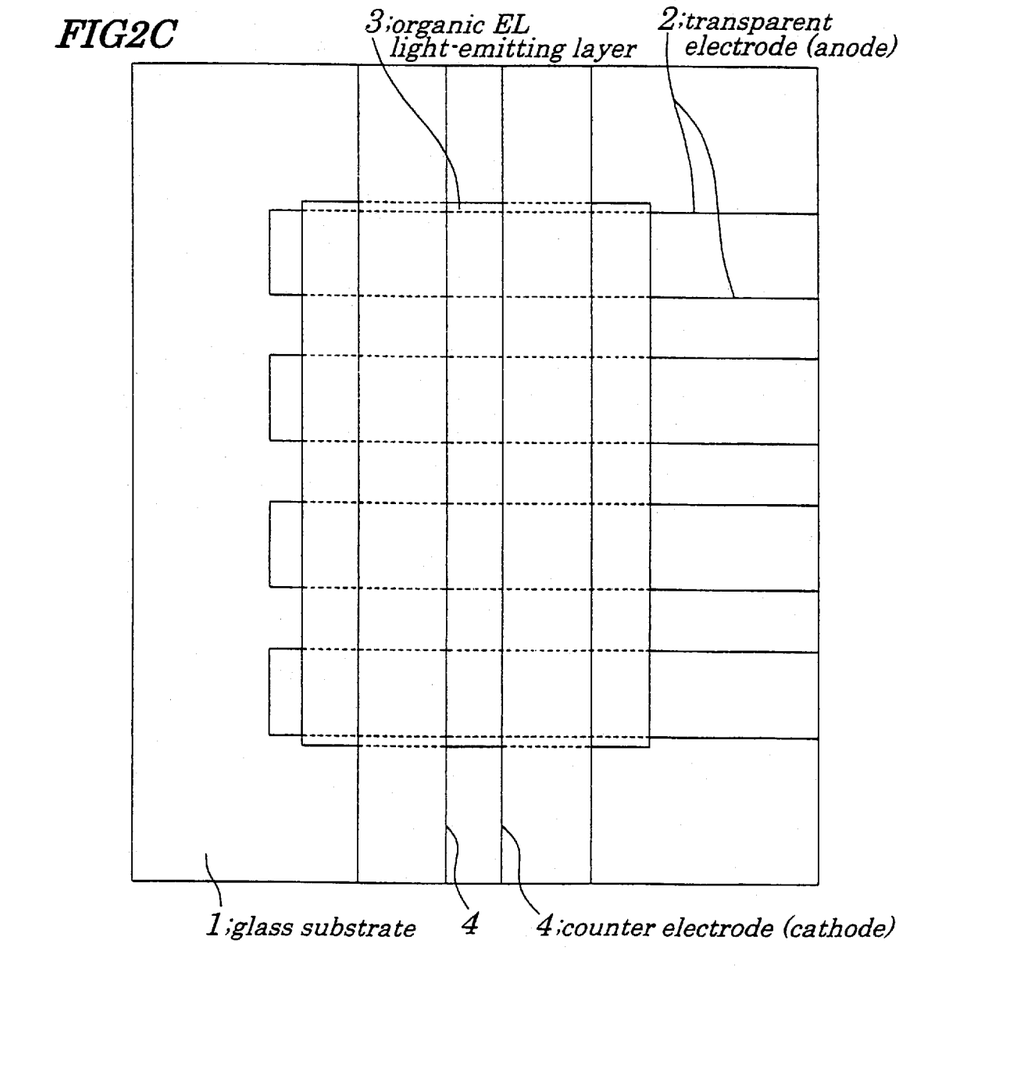
Figure 4A:
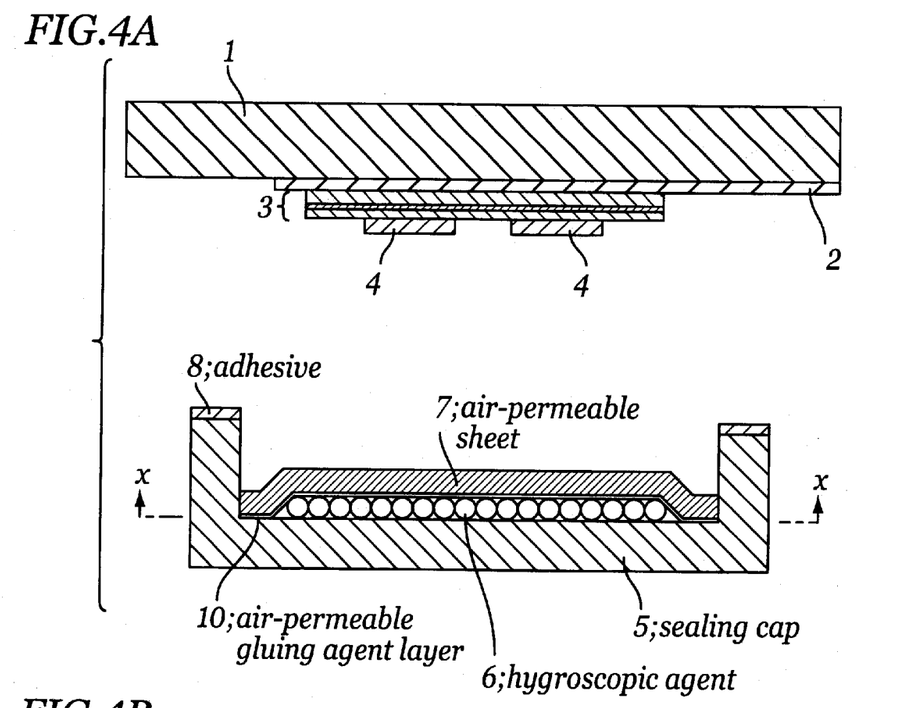
FIGS. 4A and 4B are process diagrams showing still another process, that is a process of sealing the organic EL layer-stacked body, in the method of manufacturing the organic EL display panel according to the first embodiment.
Figure 4B:
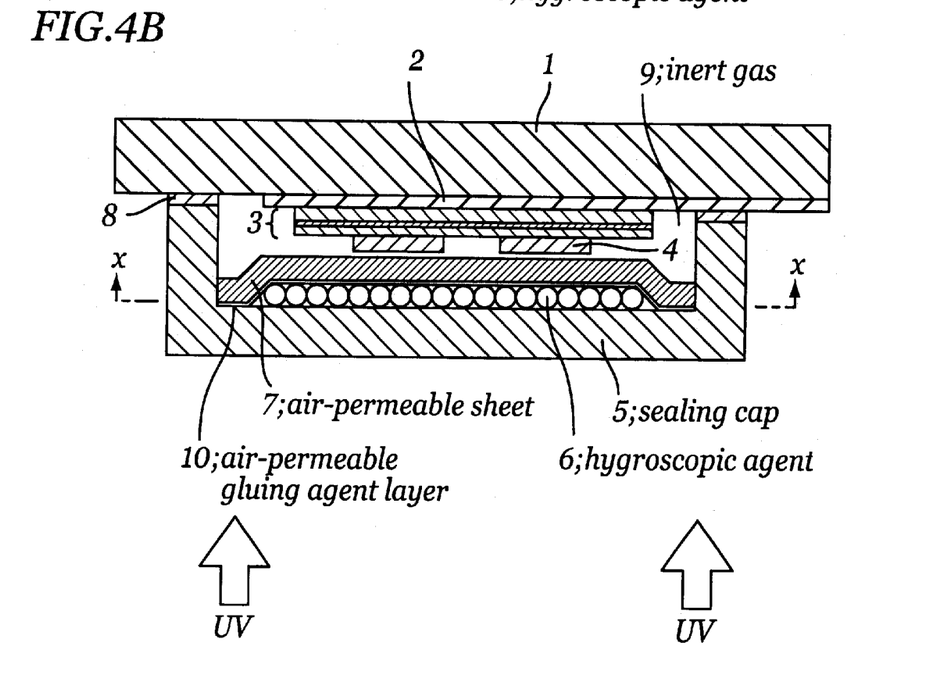
Figure 5:
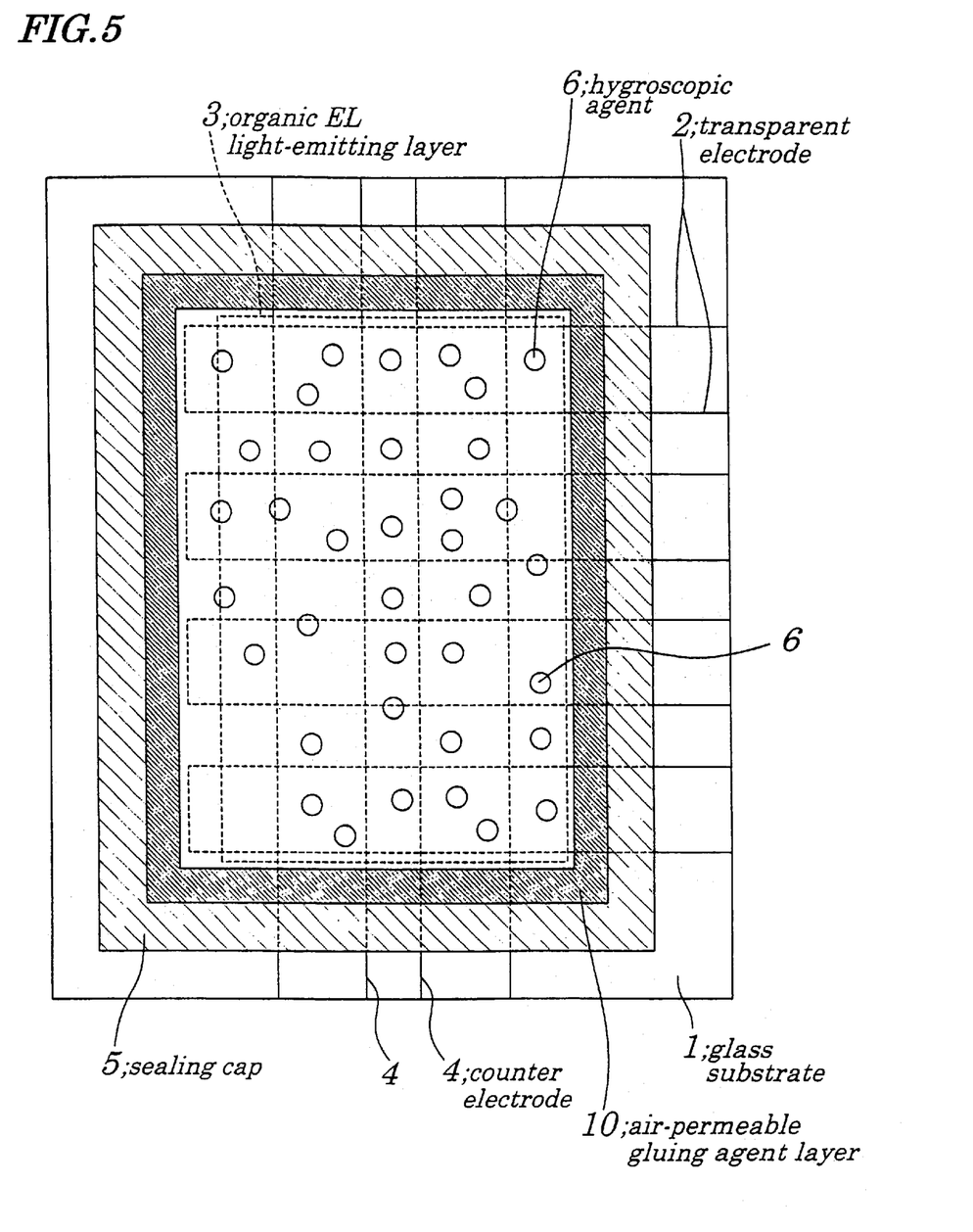
FIG. 5 is a transverse cross-sectional view of the organic EL display panel of FIG. 4B taken along a line X—X in a direction of arrows.

FIG. 1 is a cross-sectional view showing configurations of an organic EL display panel according to a first embodiment of the present invention. FIGS. 2A to 2C are process diagrams. illustrating, in order of processes, one method for manufacturing the organic EL display panel according to the first embodiment. FIGS. 3A to 3D are process diagrams illustrating, in order of processes, another method for manufacturing the organic EL display panel according to the first embodiment. FIGS. 4A and 4B are also process. diagrams illustrating, in order of processes, still another method for manufacturing the organic EL display panel according to the first embodiment of the present invention. FIG. 5 is a transverse cross-sectional view of the organic EL display panel of FIG. 4B taken along a line X—X in a direction of arrows.

The organic EL display panel of the first embodiment is a direct-current-drive type organic EL display panel in upper and lower portions of an organic EL layer-stacked body of which electrode layers are formed where its anode is formed on a glass substrate side. As shown in FIG. 1, the organic EL display device of the first embodiment is mainly composed of a transparent and flat glass substrate 1, an organic EL layer-stacked body 30 disposed on the transparent and flat glass substrate 1 in which a transparent electrode (anode) 2, an organic EL light-emitting layer 3 made from an organic electroluminescent material and a counter electrode (cathode) 4 are stacked in this order, a sealing cap 5 to seal the organic EL layer-stacked body 30, a hygroscopic agent 6 in powder or grain form adhering to an inside surface of the sealing cap 5 placed opposite to the organic EL layer-stacked body 30 and an air-permeable sheet 7 adapted to cover the hygroscopic agent 6 and hold it.

The organic EL light-emitting layer 3 is composed of a hole transporting layer 3a made from a triphenylamine derivative or a like, a light-emitting layer 3b made from a stilbene derivative or a like and an electron transporting layer 3c made from a perylene derivative or a like, each being stacked in order. Moreover, the transparent electrode 2 composed of ITO or a like and the counter electrode 4 are formed in a manner that they intersect at right angles with the organic EL light-emitting layer 3 sandwiched between the transparent electrode 2 and the counter electrode 4. Two or more transparent electrodes 2 are arranged in parallel, in a specific pattern and in a stripe-like form and organic EL picture elements serving as light-emitting display units are formed at points of intersection of the transparent electrodes 2 and the counter electrodes 4, which make up a dot-matrix type display device.

The sealing cap 5 is formed as a capping body constructed of a bottom plate portion (with a thickness of about 0.2 mm) placed opposite to the organic EL layer-stacked body 30 formed on the transparent and flat glass substrate 1 and a side wall portion (with a height of about 0.4 mm) formed in a manner that it erects along an edge region of the bottom plate portion. The sealing cap 5 has a concave section with a depth of about 0.4 mm. An upper end of the side wall portion is stuck to the transparent and flat glass substrate 1 using an ultraviolet-ray setting type adhesive 8 (not shown) which is sandwiched between the sealing cap 5 and the transparent and flat glass substrate 1. In a cavity of the concave section is hermetically enclosed inert gas 9 such as argon gas or a like. Thus, the organic EL layer-stacked body 30 is sealed hermetically by the sealing cap 5.

On a bottom face of the sealing cap 5 is mounted the air-permeable sheet 7 with a thickness of 20 μm to 200 μm in a manner that a clearance is left to an extent that the air-permeable sheet 7 does not come in touch with the organic EL layer-stacked body 30. The hygroscopic agent 6 in powder or grain form is inserted between the air-permeable sheet 7 and the bottom face of the concave section of the sealing cap 5 in a manner that the hygroscopic agent 6 and the air-permeable sheet 7 are fitly housed in the sealing cap 5. Moreover, an air-permeable gluing agent layer 10 is formed on a face, out of two faces including a surface and a back face of the air-permeable sheet 7, being opposite to the sealing cap 5. A region other than edge portion of the air-permeable gluing agent layer 10 is used to uniformly hold the hygroscopic agent 6 on the air-permeable sheet 7 and the edge portion of the air-permeable gluing agent layer 10 is used to bond the air-permeable sheet 7 to the sealing cap 5.

A material for the air-permeable sheet 7 must have properties that it does not allow the hygroscopic agent 6 in powder or grain form to be permeated and allows air to be permeated and that it can absorb visible light and can block ultraviolent rays. Therefore, in the first embodiment, woven or nonwoven fabric of a black cloth, paper, synthetic resin such as a nylon, ethylene tetrafluoride resin or a like may be used, if necessary, after coloring them. As a gluing agent used for the air-permeable gluing agent layer 10 in the first embodiment, preferably a rubber, acrylic or silicone gluing agent may be used.

Though both a hygroscopic agent chemically absorbing moisture and a hygroscopic agent physically absorbing moisture may be used as the hygroscopic agent 6 in the first embodiment, the hygroscopic agent that can be made powdered or granular should be used. The hygroscopic agent 6 that may be preferably used in the first embodiment includes diphosphorous pentaoxide, anhydrone, dehydrite, anhydrous calcium sulfate, anhydrous calcium sulfide, calcium hydroxide, anhydrous calcium chloride, alkaline earthmetal oxide such as calcium oxide, magnesium oxide, activated alumina, silica gel, charcoal or a like. These are examples and the present invention is not limited to these substances. Moreover, the powder or the grain of the hygroscopic agent 6 is preferably 10 μm to 200 μm in diameter.

Next, a method for manufacturing the organic EL display panel having configurations as explained above will be described hereinafter by referring to FIG. 2A to FIG. 5. The organic EL display panel of the first embodiment is fabricated with processes including a process of forming the organic EL layer-stacked body 30 on the transparent and flat glass substrate 1, a process of mounting the hygroscopic agent 6 in powder or grain form and the air-permeable sheet 7 used to coat and hold the hygroscopic agent 6 in the concave regions of the sealing cap 5 in a manner that the hygroscopic agent 6 and air-permeable sheet 7 are fitly housed within the sealing cap 5 and a process of sealing the organic EL layer-stacked body 30 formed on the transparent and flat glass substrate 1. First, the process of forming the organic EL layer-stacked body 30 on the transparent and flat glass substrate 1 will be described by referring to FIGS. 2A to 2C. The transparent and flat glass substrate 1 is first prepared, on a back surface of which ITO or a like is deposited and patterning is performed using photolithography to form the transparent electrode 2 which is stripe-like (see FIGS. 2A and 2C). Then, on the transparent and flat glass substrate 1 where the transparent electrode 2 is formed, a triphenylamine derivative, a stilbene derivative and a perylene derivative are sequentially deposited and, using a shadow mask, films having a desired pattern are formed to obtain the organic EL light-emitting layer 13 composed of a stacked hole transporting layer 3a, light-emitting layer 3b, electron transporting layer 3c (see FIGS. 2B and 2C). Finally, an aluminum film is formed by using a deposition method and patterning is performed using a mask to form the counter electrode (cathode) 4 disposed to be orthogonal to the transparent electrode 2(see FIGS. 2B and 2C).

Figure 3A:
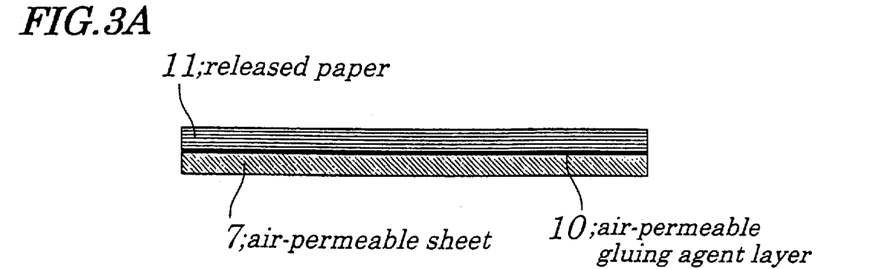
FIGS. 3A to 3D are process diagrams showing another process, that is a process of fabricating the sealing cap, in the method of manufacturing the organic EL display panel according to the first embodiment.
Figure 3B:
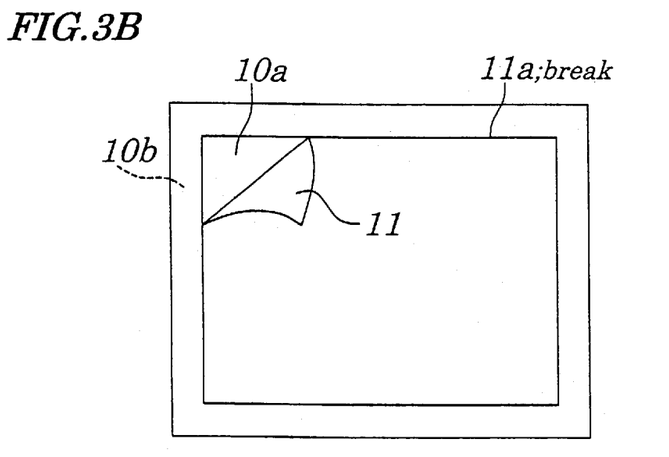
Figure 3C:
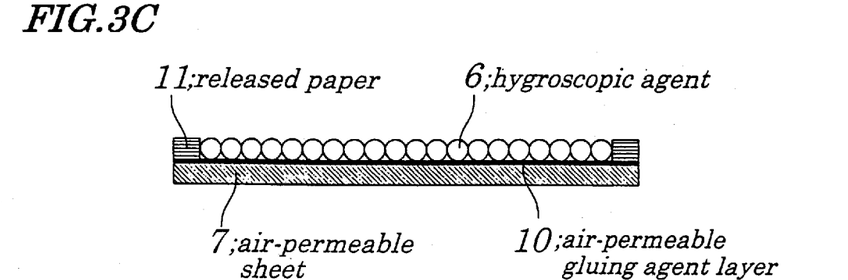
Figure 3D:
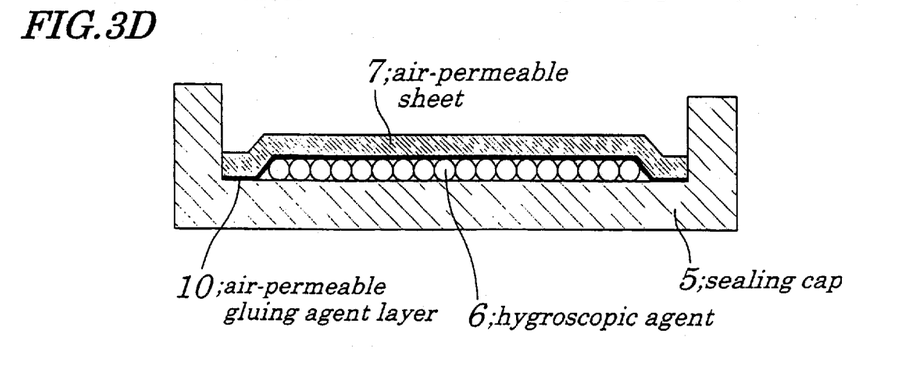

Next, a process of fabricating the sealing cap 5 in which the hygroscopic agent 6 and the air-permeable sheet 7 are housed is described by referring to FIGS. 3A to 3D. First, as shown in FIG. 3D, the sealing cap 5 having the concave region with a depth of about 0.4 mm is assembled. The sealing cap 5 is obtained by sticking a transparent glass plate for the bottom plate portion with a thickness of about 0.2 mm to a glass piece for the side wall portion with a height of about 0.4 mm. Moreover, such the sealing cap 5 may be fabricated by forming the concave region by carrying out a sandblast process on transparent glass plate or by thermally forming a region surrounding transparent glass plate. The air-permeable sheet 7 to a surface of which the air-permeable gluing agent layer 10 covered with released paper 11 is attached and which is composed of black cloth, paper or a synthetic resin is prepared in a manner as shown in FIG. 3A. A demarcation line (not shown) is then provided to partition an entire region of the air-permeable gluing agent layer 10 attached to the air-permeable sheet 7 into a first gluing agent region 10a to be used for sticking the hygroscopic agent 6 in powder or grain form (the region other than edge portion) to the air-permeable sheet 7 and a second gluing agent region 10b (edge portion) to be used for bonding the air-permeable sheet 7 to the sealing cap 5, in advance, to the air-permeable gluing agent layer 10 as shown in FIG. 3B. Then, a break 11a is given, with a cutter (not shown), along the demarcation line (see FIG. 3B and FIG. 5), on the released paper 11 covering the air-permeable gluing agent layer 10.

Next, the released paper 11 existing inside the break 11a is peeled off, as shown in FIG. 3B, to make the first gluing agent region 10a exposed and then the hygroscopic agent 6 is provided in a manner that it adheres uniformly to the entire first gluing agent region 10a, as shown in FIG. 3C. At this point, uniform adhesion of the hygroscopic agent 6 is achieved by shaking off excessive hygroscopic agent 6 not adhering to the air-permeable gluing agent layer 10. By shaking off excessive hygroscopic agent 6, a thin, single and reproducible layer of the hygroscopic agent 6 is formed on the air-permeable gluing agent layer 10.

Remaining portions (the edge portion) of the released paper 11 are peeled off to make the second gluing agent region 10b exposed and the air-permeable sheet 7 to which the hygroscopic agent 6 is stuck is bonded to the sealing cap 5, with the exposed second gluing agent region 10b sandwiched between the air-permeable sheet 7 and the sealing cap 5.

Next, a process of sealing the organic EL layer-stacked body 30 formed on the transparent and flat glass substrate 1 by using the sealing cap 5 containing the hygroscopic agent 6 and air-permeable sheet 7 will be described by referring to FIGS. 4A and 4B. First, as shown in FIG. 4A, a coating of the ultraviolet-ray setting adhesive 8 is applied to an upper end of the side wall portion of the sealing cap 5. The sealing cap 5 is put on the organic EL layer-stacked body 30 in an atmosphere of inert gas 9 such as argon gas and an upper end of the sealing cap 5 is then bonded to the transparent and flat glass substrate 1 with unhardened ultraviolet ray setting adhesive 8 sandwiched between the upper end of the sealing cap 5 and the transparent and flat glass substrate 1. Then, as shown in FIG. 4B, the hygroscopic agent 6 is irradiated with ultraviolet rays from the sealing cap side 5 to solidify the air-permeable gluing agent layer 10 for sticking the hygroscopic agent 6. Solidification of the ultraviolet ray setting adhesive 8 causes the sealing cap 5 to be bonded to the transparent and flat glass substrate 1 and the organic EL layer-stacked body 30 is enclosed hermetically with the inert gas 9 such as the argon gas enclosed hermetically in the cavity of the concave section in the sealing cap 5. Thus, production of the organic EL display panel of the first embodiment is completed.

As described above, according to the first embodiment, since the hygroscopic agent 6 in powder or grain form is uniformly stuck to the air-permeable sheet 7 by using the air-permeable gluing agent layer 10 mounted to the back of the air-permeable sheet 7, the organic EL display panel can be so configured to be of a thin-profile type.

Also, according to the first embodiment, since the hygroscopic agent 6 is of the powdered or the granular type, allowing a wider surface area to be secured, it is made possible to obtain a high hygroscopic efficiency and to maintain stable light-emitting performance. Moreover, since the air-permeable sheet 7 can absorb visible light, reflection of light from a rear side can be prevented when the organic EL display panel is ON, thus providing excellent display contrast.

Also, according to the first embodiment, in the method for manufacturing the organic EL display panel of the embodiment, by using the air-permeable sheet 7 provided with the air-permeable gluing agent layer 10 being covered with the released paper 11 and by giving the break 11a, with the cutter (not shown), to the released paper 11, the area of the air-permeable gluing agent layer 10 is partitioned into two regions, one being the first gluing agent region 10a (the region other than edge region) to be used for sticking the hygroscopic agent 6 in powder or grain form and the other region being the second gluing agent region 10b to be used for bonding the air-permeable sheet 7 to the sealing cap 5 (edge region) and the released paper 11 existing inside the break 11a is peeled off to stick the hygroscopic agent 6 to the first gluing agent region 10a while the released paper 11 existing outside the break 11a is peeled off to bond the sealing cap 5 to the transparent and flat glass substrate 1 with the second gluing agent region 10b sandwiched between the sealing cap 5 and the transparent and flat glass substrate 1. Thus, this method makes it possible to mount the hygroscopic agent 6 promptly, readily and reliably in a manner that it can be mounted uniformly.

Furthermore, according to the first embodiment, since the air-permeable sheet 7 can block ultraviolet rays, the organic EL light-emitting layer 3 being susceptible to ultraviolet rays can be protected efficiently when the hygroscopic agent 6 is irradiated with the ultraviolet rays from the sealing cap 5 side.

Second Embodiment

FIGS. 6A to 6E are process diagrams showing, in order of processes, a method of manufacturing an organic EL display panel according to a second embodiment of the present invention. The method of manufacturing the organic EL display panel of the second embodiment differs greatly from that of the first embodiment in that a released paper mold 12 is newly employed as shown in FIGS. 6A to 6D to fabricate the organic EL display panel, instead of a released paper 11 (see FIG. 3A) adapted to protect an entire surface of an air-permeable gluing agent layer 10 being stuck to an air-permeable sheet 7 used in the first embodiment. That is, as shown in FIGS. 6A to 6D, the released paper mold 12 has its opening portion 12a to be used as a jig for sticking a hygroscopic agent 6 to the air-permeable gluing agent layer 10. The released paper mold 12 is so configured that a length of an opening portion 12a of the released paper mold 12, that is, a diameter of a hole formed in the released paper mold 12 as the opening portion is equal to a length of a first gluing agent region 10a (a region other than edge portion) of whole air-permeable gluing agent layer 10 and only the first gluing agent region 10a is used for sticking the hygroscopic agent 6.

A method for manufacturing the organic EL display panel of the second embodiment will be explained below. In the second embodiment, processes other than the process of sticking the hygroscopic agent 6 in powder or grain format to an air-permeable sheet 13 are same as those in the first embodiment and therefore, in FIGS. 6A to 6E, same reference numbers are assigned to parts having same functions as for the first embodiment and descriptions of them are omitted accordingly.

Figure 6A:
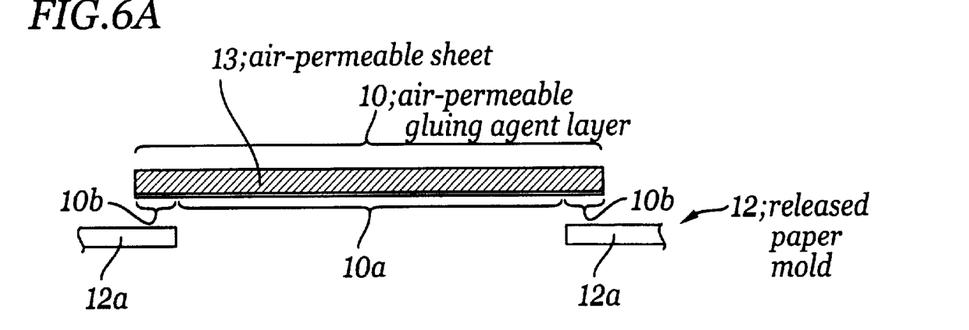
FIGS. 6A to 6E are process diagrams showing, in order of processes, a method of manufacturing an organic EL display panel according to a second embodiment of the present invention.
Figure 6B:
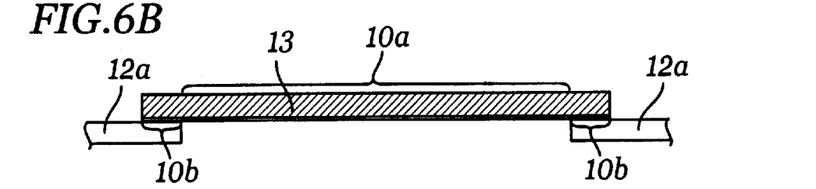
Figure 6C:
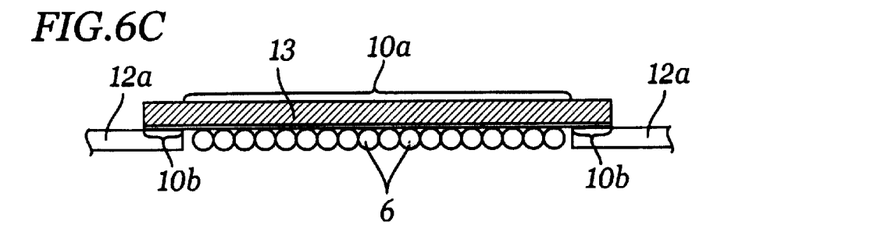
Figure 6D:
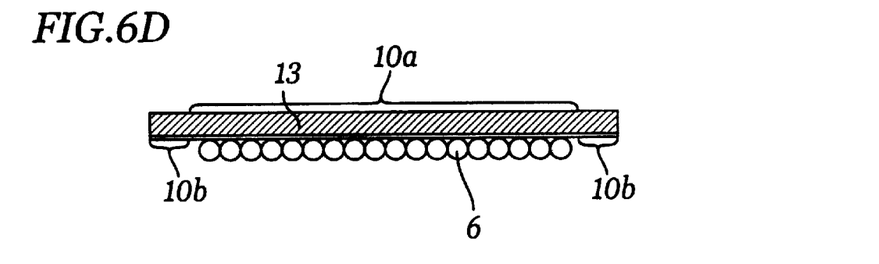
Figure 6E:
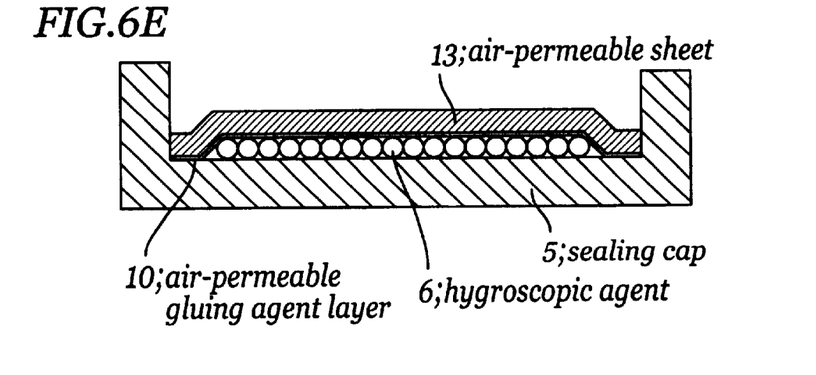

In the method of the second embodiment, a coating of a rubber, acrylic or silicone gluing agent (herein after called a gluing agent) is applied to a back face of the air-permeable sheet 13 to form the air-permeable gluing agent layer 10 (see FIG. 6A). Then, the released paper mold 12 which has been fabricated in advance is held to the air-permeable gluing agent layer 10 composed of the first gluing agent region 10a (the region other than its edge region) to be used to stick the hygroscopic agent 6 and second gluing agent region 10b (edge region) to be used for bonding the air-permeable sheet 13 to a sealing cap 5 in a manner that the second gluing agent region 10b and the end portion 12a of the released paper mold 12 overlap each other (see FIG. 6B).

Then, the hygroscopic agent 6 is sprinkled on the air-permeable gluing agent layer 10, to the second gluing agent region 10b of which the end portion 12a of the released paper mold 12 is held. Due to a screen effect of the released paper mold 12, however, the sprinkled hygroscopic agent 6 adheres only to a region of the air-permeable gluing agent layer 10 within the opening portion of the released paper mold 12, that is, only to the first gluing agent region 10a (see FIG. 6C). Though the hygroscopic agent 6 has not yet adhered in a uniform and even state at this point, by shaking off excessive hygroscopic agent 6 not adhering to the first gluing agent region 10a, the uniform adhesion of the hygroscopic agent 6 is implemented. That is, by shaking off excessive hygroscopic agent 6, a thin, single and reproducible layer of the hygroscopic agent 6 is formed on the first gluing agent region 10a. After this process, the released paper mold 12 is removed from the air-permeable gluing agent layer 10 (see FIG. 6D). The second gluing agent region 10b are exposed when the released paper mold 12 has been taken off and exposed second gluing agent region 10b are then used to bond the air-permeable sheet 13 to which the hygroscopic agent 6 is stuck to the sealing cap 5.

Thus, according to the second embodiment, same effects obtained by the first embodiment can be achieved. Additionally, since the released paper mold 12 can be used any number of times, it serves to reduce costs for fabrication.

Figure 7:
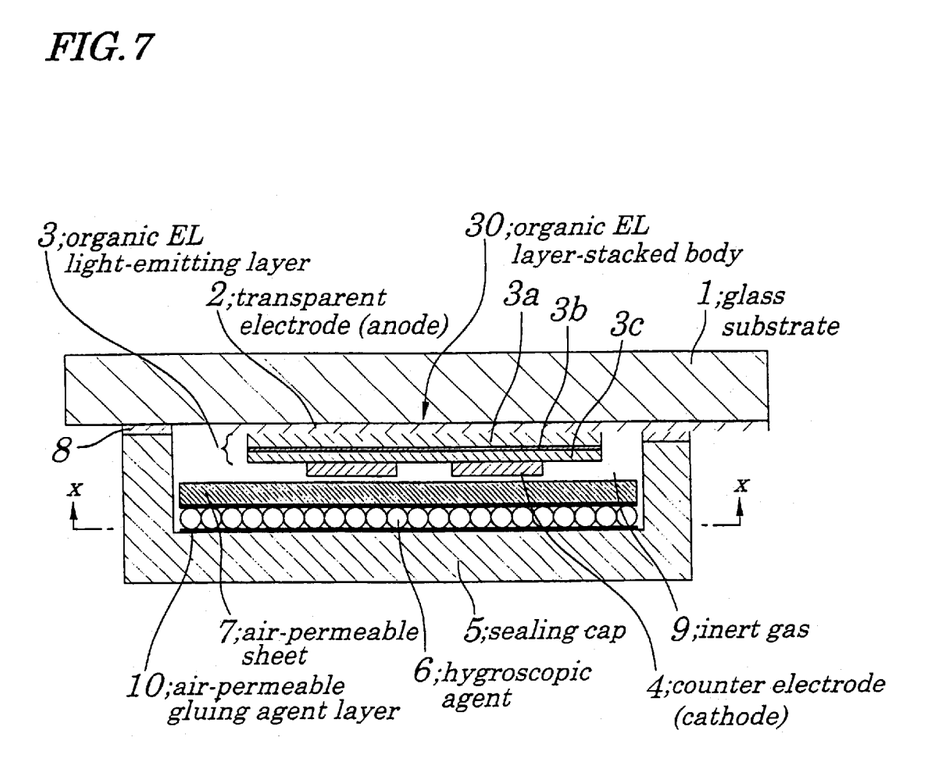
FIG. 7 is a cross-sectional view of a modified organic EL display panel according to the first or second embodiment of the present invention.

It is apparent that the present invention is not limited to the above embodiments but may be changed and modified without departing from the scope and spirit of the invention. For example, the sealing cap 5 composed of an opaque material may be used. The organic EL display panel may be not only of a direct-current drive type but also of an alternating-current-drive type. The organic EL layer-stacked body 30 may be not only of a three-layer structure but also of two-layer or four-layer structure. Not only a transparent and flat glass substrate 1 but also other substrate so long as it is transparent may be employed. When the gluing agent for sticking the hygroscopic agent 6 is solidified, it may be irradiated with ultraviolet rays not only from the sealing cap 5 side but also from the transparent and flat glass substrate 1 side. In the above embodiments, the hygroscopic agent 6 in powder or grain form is stuck to the air-permeable sheet 13 by using the gluing agent, however, instead of the gluing agent, an air-permeable adhesive may be used. As the gluing agent layer 10, a double-faced gluing tape or single-faced gluing tape may be used. The sealing cap 5 does not necessarily require a concave portion and also may be of a flat type if only a spacer to be used for a side wall portion is used separately. In the above embodiments, the edge region of the entire gluing agent region is used as the second gluing agent region 10b to bond the air-permeable sheet 13 to the sealing cap 5 and the region other than the edge region is used as the first gluing agent region 10a to stick the hygroscopic agent 6 in powder or grain form, however, it is not necessarily required that the edge region is set to the second gluing agent region 10b and that the region other than the edge region is set to the first gluing agent region 10a. In the above embodiments, apart of the gluing agent region is used as the second gluing agent region 10b to bond the air-permeable sheet 13 to the sealing cap 5, however, by mounting an adhesive layer to both the sealing cap 5 and air-permeable sheet 13, as shown in FIG. 7, the second gluing agent region 10b may be removed, which allows more amounts of the hygroscopic agent 6 to be mounted. It is also not necessarily required that a color of the air-permeable sheet 13 is black so long as it is of an ultraviolet-ray blocking type and that the color of the air-permeable sheet 13 may be black so long as it is of a visible-ray absorbing type or of an anti-reflective type. Moreover, it is not necessarily required, depending applications or methods of manufacturing, that the air-permeable sheet 13 is of a visible-ray absorbing type, anti-reflective type or ultraviolet-ray blocking type. In this case, the hygroscopic agent 6 in powder or grain form in black color may be used. Depending on applications, use of the air-permeable sheet 13 may be omitted and, if the air-permeable sheet 13 is not used, the hygroscopic agent 6 in powder or grain form may be stuck to an inner face of the sealing cap 5 with the gluing agent or a gluing agent sheet sandwiched between the hygroscopic agent 6 and the sealing cap 5. Furthermore, it is not required that a material itself for the air-permeable sheet 13 is of an air-permeable type, that is, any sheet may be used as the air-permeable sheet 13 so long as it is provided with permeability by, for example, being configured so as to be of a mesh-like or texture-like structure.

What is claimed is:

1. An organic electro-luminescent display panel comprising:

a transparent insulating substrate;

an organic electro-luminescent device formed on said transparent insulating substrate;

a sealing cap placed on said transparent insulating substrate to make up sealed space hermetically containing said organic electro-luminescent device;

a hygroscopic agent hermetically enclosed in said sealed space and disposed in a manner to be sandwiched between said sealing cap and an air-permeable sheet; and a gluing agent layer for fixedly holding said hygroscopic agent, wherein said gluing agent layer holding said hygroscopic agent is mounted on an inside surface of at least one of said sealing cap and said air-permeable sheet.

2. The organic electro-luminescent display panel according to claim 1, wherein said hygroscopic agent is of a powder or grain type.

3. The organic electro-luminescent display panel according to claim 1, wherein said air-permeable sheet absorbs visible light.

4. The organic electro-luminescent display panel according to claim 3, wherein said air-permeable sheet is an ultraviolet-ray blocking sheet.

5. The organic electro-luminescent display panel according to claim 1, wherein said hygroscopic agent is stuck to said air-permeable sheet by a gluing agent layer sandwiched between said hygroscopic agent and said air-permeable sheet.

6. The organic electro-luminescent display panel according to claim 5, wherein said gluing agent layer is mounted on a lower surface of said air-permeable sheet being opposite to said sealing cap and wherein said hygroscopic agent is stuck to said air-permeable sheet in a region of said gluing agent layer inside an outer edge of said air-permeable sheet, said gluing agent layer being sandwiched between said hygroscopic agent and said air-permeable sheet while said air-permeable sheet is bonded to said sealing cap at a region of said gluing agent layer near the outer edge of said air-permeable sheet and sandwiched between said air-permeable sheet and said sealing cap.

7. A method for manufacturing an organic electroluminescent display panel to produce said organic electroluminescent display panel provided with a transparent insulating substrate, an organic electro-luminescent device formed on said transparent insulating substrate and a sealing cap hermetically containing said organic electro-luminescent device to form sealed space enclosing hygroscopic agent in cooperation with said transparent insulating substrate, said method comprising:

a process of preparing an air-permeable sheet provided with a gluing agent layer covered with released paper on its surface;

a process of partitioning a region of said gluing agent layer into a first gluing agent region for sticking said hygroscopic agent in powder or grain form and second gluing agent region for bonding said air-permeable sheet to said sealing cap;

a process of peeling off a portion of said released paper covering said first gluing agent region to expose said first gluing agent region and sticking said hygroscopic agent in powder or grain form to exposed said first gluing agent region; and a process of peeling off a remaining portion of said released paper to expose said second gluing agent region and bonding said air-permeable sheet with said hygroscopic agent being stuck to said sealing cap with exposed said second gluing agent region sandwiched between said air-permeable sheet and said sealing cap.

8. A method for manufacturing an organic electroluminescent display panel to produce said organic electroluminescent display panel provided with a transparent insulating substrate, an organic electro-luminescent device formed on said transparent insulating substrate and a sealing cap hermetically containing said organic electro-luminescent device to form sealed space enclosing hygroscopic agent in cooperation with said transparent insulating substrate, said method comprising:

a process of preparing an air-permeable sheet with a gluing agent layer mounted on a surface of said air-permeable sheet;

a process of partitioning a region of said gluing agent layer into a first gluing agent region for sticking said hygroscopic agent in powder or grain form and second gluing agent region for bonding said air-permeable sheet to said sealing cap;

a process of holding a mold member to said second gluing agent region with said first gluing agent region being left exposed and sticking said hygroscopic agent on exposed said first gluing agent region to said first gluing agent region; and a process of making said second gluing agent region exposed by removing said mold member and bonding said air-permeable sheet with said hygroscopic agent stuck to said sealing cap with exposed said second gluing agent region sandwiched between said air-permeable sheet and said sealing cap.

9. The method for manufacturing the organic electroluminescent display panel according to claim 7, wherein edge region of said gluing agent layer is used as said second gluing agent region and remaining region of said gluing agent layer other than said edge region is used as said first gluing agent region.

10. The method for manufacturing the organic electroluminescent display panel according to claim 8, wherein edge region of said gluing agent layer is used as said second gluing agent region and remaining region of said gluing agent layer other than said edge region is used as said first gluing agent region.

11. The method for manufacturing the organic electroluminescent display panel according to claim 7, wherein a demarcation line is provided by giving a break to said released paper covering said gluing agent layer to partition said region of said gluing agent layer into said first gluing agent region and said second gluing agent region.

12. The method for manufacturing the organic electroluminescent display panel according to claim 7, wherein, after said air-permeable sheet to which said hygroscopic agent in powder or grain form is stuck has been bonded to said sealing cap, said sealing cap is junctioned, in an atmosphere of inert gas, to said transparent insulating substrate by using an ultraviolet setting adhesive sandwiched between said sealing cap and said transparent insulating substrate.

13. The method for manufacturing the organic electroluminescent display panel according to claim 8, wherein, after said air-permeable sheet to which said hygroscopic agent in powder or grain form is stuck has been bonded to said sealing cap, said sealing cap is junctioned, in an atmosphere of inert gas, to said transparent insulating substrate by using an ultraviolet setting adhesive sandwiched between said sealing cap and said transparent insulating substrate.

14. The organic electro-luminescent display panel according to claim 5, wherein said hygroscopic agent is further stuck to said sealing cap by a gluing agent layer sandwiched between said hygroscopic agent and said sealing cap.

15. The organic electro-luminescent display panel according to claim 1, wherein said hygroscopic agent is in grain form.

16. The organic electro-luminescent display panel according to claim 15, wherein the diameter of the grains is between 10 micrometers and 200 micrometers.

17. The organic electro-luminescent display panel according to claim 1, wherein said hygroscopic agent is selected from the group consisting of diphosphorus pentaoxide, anhydrone, dehydrite, anhydrous calcium sulfate, anhydrous calcium sulfide, calcium hydroxide, anhydrous calcium chloride, calcium oxide, magnesium oxide, activated alumina, silica gel and charcoal.

18. The organic electro-luminescent display panel according to claim 1, wherein said gluing layer comprises an air-permeable glue selected from the group consisting of rubber, acrylic and silicone glues.

* * * * *